United States Patent
Aizawa et al.

(10) Patent No.: US 12,417,925 B2
(45) Date of Patent: Sep. 16, 2025

(54) METHOD OF CONDUCTIVE MATERIAL DEPOSITION

(71) Applicant: Tokyo Electron Limited, Tokyo (JP)

(72) Inventors: Hirokazu Aizawa, Albany, NY (US);
Kai-Hung Yu, Albany, NY (US);
Nicholas Joy, Albany, NY (US);
Yusuke Yoshida, Albany, NY (US);
Kandabara Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 387 days.

(21) Appl. No.: 18/070,030

(22) Filed: Nov. 28, 2022

(65) Prior Publication Data
US 2024/0178003 A1   May 30, 2024

(51) Int. Cl.
| | |
|---|---|
| *H01L 21/3213* | (2006.01) |
| *G03F 7/00* | (2006.01) |
| *H01L 21/02* | (2006.01) |
| *H01L 21/033* | (2006.01) |
| *H01L 21/3205* | (2006.01) |

(52) U.S. Cl.
CPC .... *H01L 21/32133* (2013.01); *G03F 7/70733* (2013.01); *H01L 21/02164* (2013.01); *H01L 21/02263* (2013.01); *H01L 21/02318* (2013.01); *H01L 21/0337* (2013.01); *H01L 21/32051* (2013.01); *H01L 21/32055* (2013.01)

(58) Field of Classification Search
CPC ............ H10B 12/488; H01L 21/76877–76898
See application file for complete search history.

(56) References Cited

U.S. PATENT DOCUMENTS

| | | | |
|---|---|---|---|
| 10,790,287 | B2 | 9/2020 | Kang et al. |
| 2009/0266418 | A1 | 10/2009 | Hu et al. |
| 2010/0215543 | A1 | 8/2010 | Henry et al. |
| 2017/0040423 | A1 | 2/2017 | Inoue et al. |
| 2017/0053918 | A1* | 2/2017 | Cheng .................. H10D 64/251 |
| 2018/0005903 | A1* | 1/2018 | Basker .................. H01L 23/485 |
| 2019/0067295 | A1* | 2/2019 | Simsek-Ege ............ C23C 16/06 |
| 2020/0365392 | A1 | 11/2020 | Chen et al. |
| 2021/0126090 | A1* | 4/2021 | Kim ....................... H10D 30/60 |
| 2021/0375750 | A1 | 12/2021 | Chu et al. |
| 2022/0278108 | A1 | 9/2022 | Yang et al. |

FOREIGN PATENT DOCUMENTS

KR    20210045970 A    4/2021

OTHER PUBLICATIONS

International Search Report and Written Opinion, PCT/US2023/078198, mailed Feb. 22, 2024, Total pp. 12.

* cited by examiner

*Primary Examiner* — Erik Kielin
(74) *Attorney, Agent, or Firm* — Slater Matsil, LLP

(57) ABSTRACT

A method for processing a substrate that includes: depositing a filling material over the substrate including a first recess and a second recess, the filling material filling the first recess and the second recess; patterning the filling material such that the first recess is reopened while the second recess remains filled with the filling material; filling the first recess with a conductive material to a first height; etching the filling material selectively to the conductive material to reopen the second recess; filling a remainder of the first recess and the second recess with the conductive material; and performing an etch back process to etch the conductive material such that the first recess and the second recess are filled with the conductive material to a second height.

20 Claims, 9 Drawing Sheets

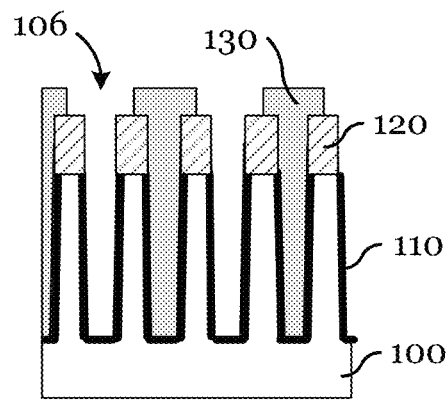
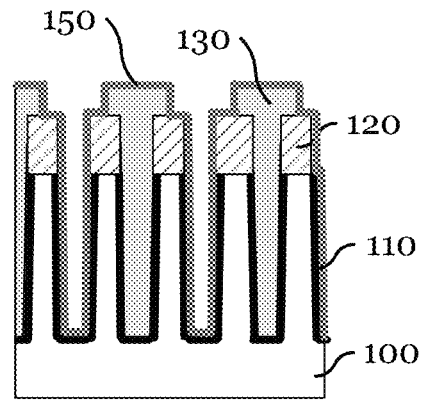
FIG. 1E
FIG. 1F
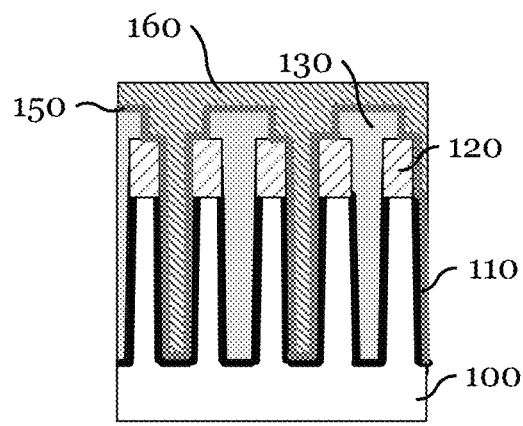
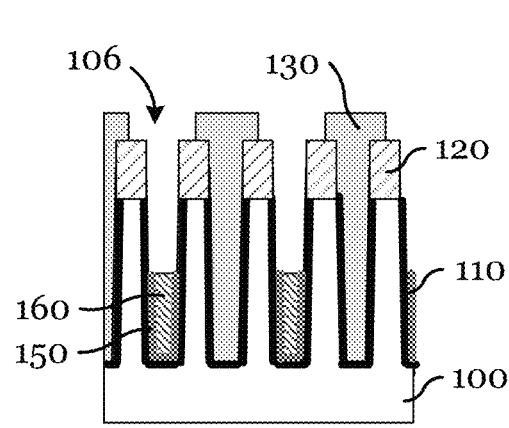
FIG. 1G
FIG. 1H

METHOD OF CONDUCTIVE MATERIAL DEPOSITION

TECHNICAL FIELD

The present invention relates generally to methods of processing a substrate, and, in particular embodiments, to conductive material deposition.

BACKGROUND

Generally, semiconductor devices used in electronics, such as mobile phones, digital cameras, and computers, are fabricated by sequentially depositing and patterning layers of dielectric, conductive, and semiconductor materials over a semiconductor substrate, using photolithography and etching to form structures that function as circuit components (e.g., transistors, resistors, and capacitors) and as interconnect elements (e.g., conductive lines, contacts and vias). Driven by a demand for low-cost electronics, the semiconductor industry has repeatedly reduced the minimum feature sizes in semiconductor devices to a few nanometers with innovations in lithography (e.g., immersion lithography and multiple patterning) to increase the packing density of components, thereby reducing the cost of integrated circuits (ICs). Further increase in density and reduction in cost is achieved using three-dimensional (3D) structures (e.g., the fin field-effect transistors (FinFET)) and, in some instances, stacking electronic components such as memory storage elements (e.g., the ferroelectric capacitor, the magnetic tunnel junction (MTJ), etc.) and precision passive components (e.g., the thin-film resistor (TFR) and the metal-insulator-metal (MIM) capacitor) in layers in between successive interconnect levels.

The diversity of materials used in IC fabrication such as semiconductors, insulators (including $SiO_2$, $Si_3N_4$, high-k gate dielectrics, and low-k dielectrics), magnetic and ferroelectric films, and metals for interconnect and electrodes poses a challenge of constant development of processing techniques for these diverse materials. Miniaturization to a few nanometers has intensified the challenge. The plasma processes are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer. Furthermore, introduction of unconventional materials (e.g., Co and Ru) at feature sizes below 20 nm may raise new issues in developing plasma etch and deposition processes compatible with conventional Si IC fabrication.

Overcoming the hurdles in providing plasma processing technology for manufacturing of scaled semiconductor devices is a challenge that requires further innovation.

SUMMARY

In accordance with an embodiment of the present invention, a method for processing a substrate that includes: depositing a filling material over the substrate including a first recess and a second recess, the filling material filling the first recess and the second recess; patterning the filling material such that the first recess is reopened while the second recess remains filled with the filling material; filling the first recess with a conductive material to a first height; etching the filling material selectively to the conductive material to reopen the second recess; filling a remainder of the first recess and the second recess with the conductive material; and performing an etch back process to etch the conductive material such that the first recess and the second recess are filled with the conductive material to a second height.

In accordance with an embodiment of the present invention, a method for processing a substrate that includes: depositing a filling material over the substrate including line recesses, the filling material filling the line recesses; patterning the filling material such that every other line of the line recesses is reopened while a remainder of the line recesses remains filled with the filling material; depositing a conductive material over the substrate, the conductive material filling the reopened line recesses to a first height; performing an etch back process to etch the conductive material such that the every other line of the line recesses is filled with the conductive material to a second height that is lower than the first height; etching the filling material to reopen the remainder of the line recesses; and filling every line recess with the conductive material to a third height.

In accordance with an embodiment of the present invention, a method for processing a substrate that includes: depositing a first filling material over the substrate including a first recess and a second recess, the first filling material filling the first recess and the second recess; patterning the first filling material such that the first recess is reopened while the second recess remains filled with the first filling material; depositing a conductive material over the substrate, the conductive material filling the first recess to a first height; performing a first etch back process to etch the conductive material such that the first recess is filled with the conductive material to a second height that is lower than the first height; depositing a second filling material such that the first recess is filled with the conductive material and the second filling material; etching the first filling material selectively to the conductive material and the second filling material to reopen the second recess; redepositing the conductive material over the substrate, the conductive material filling the second recess; and performing a second etch back process to etch the conductive material such that the first recess and the second recess are filled with the conductive material to the second height.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1L illustrate cross-sectional views of an example substrate during an example process of semiconductor fabrication comprising metal deposition at various stages in accordance with various embodiments, wherein FIG. 1A illustrates an incoming substrate comprising recesses to be filled with a metal, FIG. 1B illustrates the substrate after depositing a filling material, FIG. 1C illustrates the substrate after forming a layer stack for lithography, FIG. 1D illustrates the substrate after a lithographic process, FIG. 1E illustrates the substrate after patterning the filling material, FIG. 1F illustrates the substrate after forming a first liner layer, FIG. 1G illustrates the substrate after a first metal deposition, FIG. 1H illustrates the substrate after a first etch back, FIG. 1I illustrates the substrate after removing the filling material, FIG. 1J illustrates the substrate after forming a second liner layer, FIG. 1K illustrates the substrate after a second metal deposition, and FIG. 1L illustrates the substrate after a second etch back;

FIGS. 2A-2E illustrate cross-sectional scanning electron microscopy (SEM) images of an example Si substrate during an example process of semiconductor fabrication comprising ruthenium (Ru) deposition in accordance with various embodiments, wherein FIG. 2A illustrates an incoming Si substrate comprising line recesses to be filled with Ru, FIG. 2B illustrates the Si substrate after depositing amorphous-silicon (a-Si), FIG. 2C illustrates the Si substrate after patterning the a-Si, FIG. 2D illustrates the Si substrate after forming a tantalum nitride (TaN) liner layer and depositing Ru, and FIG. 2E illustrates the Si substrate after an etch back;

FIGS. 3A-3B illustrate cross-sectional views of an example substrate during another example process of semiconductor fabrication comprising metal deposition with two filling materials at various stages in accordance with alternate embodiments, wherein FIG. 3A illustrates the substrate after a first metal deposition followed by capping with a second filling material, and FIG. 3B illustrates the substrate after removing the first filling material, a second metal deposition, and a second etch back;

FIGS. 5A-5C illustrate process flow charts of methods of metal deposition in accordance with various embodiments, wherein FIG. 5A illustrates an embodiment process flow, FIG. 5B illustrates an alternate embodiment process flow, and FIG. 5C illustrate another alternate embodiment process flow.

DETAILED DESCRIPTION OF ILLUSTRATIVE EMBODIMENTS

Figure 1A:
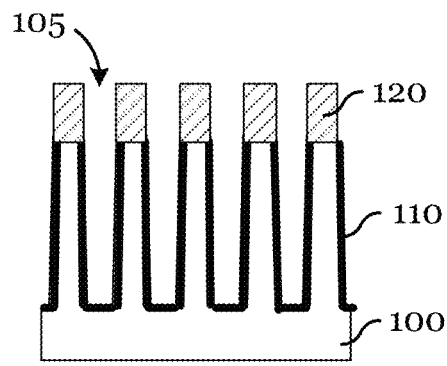

This application relates to fabrication of semiconductor devices, for example, integrated circuits comprising semiconductor devices, and more particularly to high capacity three-dimensional (3D) memory devices, such as a 3D-NAND (or vertical-NAND), 3D-NOR, or dynamic random access memory (DRAM) device. The generation of ICs commonly referred to as the 10 nm node uses less than 40 nm pitch for densely packed metal lines at the lower interconnect levels, and about 50 nm pitch for contacts to transistors. At these and smaller dimensions, the interconnect-RC delay of conventional copper (Cu) lines and tungsten (W) contacts may be limiting the speed of digital circuits. New materials are being introduced at the 10 nm nodes and below to replace dense Cu lines and W contacts. Ruthenium (Ru) metal is a leading candidate for replacing copper and tungsten in these and other applications. For example, Ru may be used for buried word line (bWL) in a DRAM device. However, it is currently difficult to apply Ru to fine pitch line/space (L/S) structures because the high stress of Ru often leads to line bending issues at such small scales (e.g., line width<20 nm). Therefore, it is desired to develop an effective method of depositing a metal (e.g., Ru) in fine pitch L/S structures without line bending issues.

Embodiments of the present application disclose methods of multi-step metal deposition using a filling material. The methods comprises selectively pre-filling some of recesses on a substrate with a filling material for structural reinforcement. The filling material provides the structural support during a first metal deposition and thereby prevents line bending. After the first metal deposition, the filling material may be removed to reopen the pre-filled portion of recesses, which can be then filled with the metal by a second metal deposition. Various embodiments of the methods further comprise a lithographic process to provide a pattern of the filling material for the selective pre-filling of recesses. The methods may advantageously enables applying a metal with high stress such as Ru to fine pitch L/S structures (e.g., bWL) by preventing line bending during deposition. The methods may also be applied to use Ru in back-end-of-line (BEOL) processes. Although this disclosure describes the methods primarily as a process of metal deposition, it should be noted that the methods are not limited to a pure metal and may be applied to any conductive material and mixture thereof that may be useful in various semiconductor device applications.

In the following, steps of metal deposition to fill recesses without line bending in accordance with various embodiments are descried referring to FIGS. 1A-1L, 2A-2E, and 3A-3B. Representative SEM images (FIGS. 2A-2E) are described along with the corresponding structures of FIGS. 1A-1H. The issue of line bending in case of metal deposition without a filling material is described referring to FIG. 4. Several embodiment process flows of metal deposition are then described referring to FIGS. 5A-5C. All Figures in the disclosure, including the aspect ratios of features, are not to scale and for illustration purposes only.

FIG. 1A illustrates a cross-sectional view of an incoming substrate 100 comprising recesses 105 to be filled with a metal.

Figure 2A:
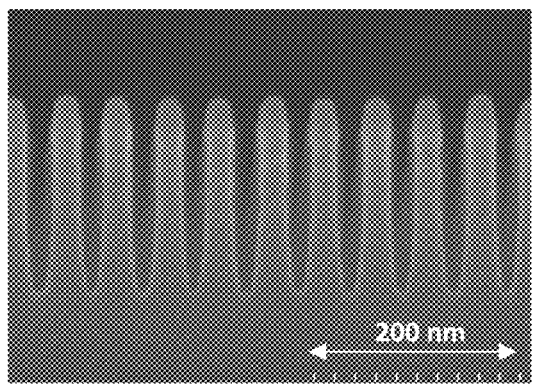

FIG. 2A illustrates a cross-sectional scanning electron microscopy (SEM) image of an incoming Si substrate comprising line recesses to be filled with ruthenium (Ru).

In one or more embodiments, the substrate 100 may be a silicon wafer, or a silicon-on-insulator (SOI) wafer. In certain embodiments, the substrate may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or including, a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein.

As further illustrated in FIG. 1A, the substrate 100 may be patterned to have recesses 105. In various embodiments, the recesses 105 may comprise a series of line recesses as a part of line/space (L/S) structures useful in fabricating a semiconductor device such as Logic device and DRAM device. In certain embodiments, the surface of the substrate 100 may be covered by an oxide layer 110 and the substrate 100 may comprise a hardmask 120 used to form the recesses 105. In certain embodiments, the oxide layer 110 may comprise silicon oxide and the hardmask 120 may comprise silicon nitride.

In various embodiments, the recesses 105 may comprise a series of parallel line recesses that separate lines (i.e., line/space (L/S) structure). In certain embodiments, the recesses 105 may comprise a L/S structure with thin lines and/or a high aspect ratio (HAR, height-to-width ratio), where the methods of this disclosure may be particularly useful. One of the recesses 105 may have a height between 20 nm and 300 nm in one embodiment, and between 100 nm and 200 nm in another embodiment. The width of one of the recesses 105 may be between 5 nm and 50 nm in one embodiment, and between 10 nm and 30 nm in another embodiment. The aspect ratio of one of the recesses 105 may be between 4:1 and 20:1. In one example, illustrated in the SEM image of FIG. 2A, the substrate may be a Si substrate and the recesses may have a pitch size about 50 nm and a height about 180 nm. The L/S structures with thin lines and a HAR tend to experience line bending and other issues in pattern distortion/collapse during metal deposition, especially when using a metal with high stress such as Ru. The features in these L/S structures, without any structural support, tend to be too weak to withstand the high stress of the metal exerted during deposition. The methods described in this disclosure may advantageously strengthen the L/S structure by selectively pre-filling some of the recesses 105 prior to metal deposition, as further described below referring to FIGS. 1B-1L.

In certain embodiments, the L/S structure defined by the recesses 105 may comprise lines with different widths and/or heights. In other embodiments, the feature defined by the recesses 105 may not be limited to parallel lines and spaces. Although not specifically illustrated, the recesses 105 to be filled by the method may have any structure that may benefit from structural reinforcement during metal deposition.

Figure 1B:
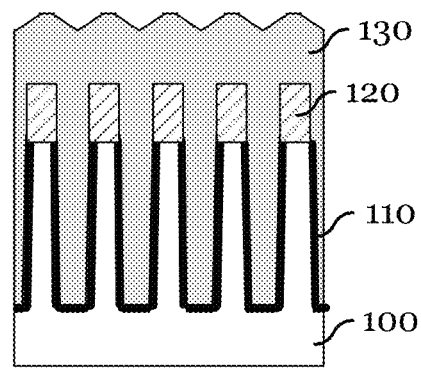

FIG. 1B illustrates a cross-sectional view of the substrate 100 after depositing a first filling material 130.

Figure 2B:
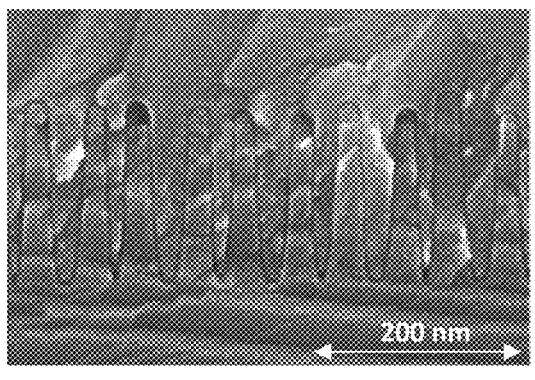

FIG. 2B illustrates a cross-sectional SEM image of the substrate after depositing amorphous-silicon (a-Si).

Figure 1C:
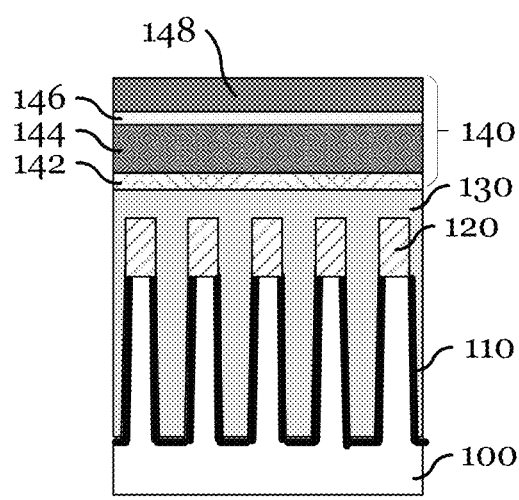
Figure 1D:
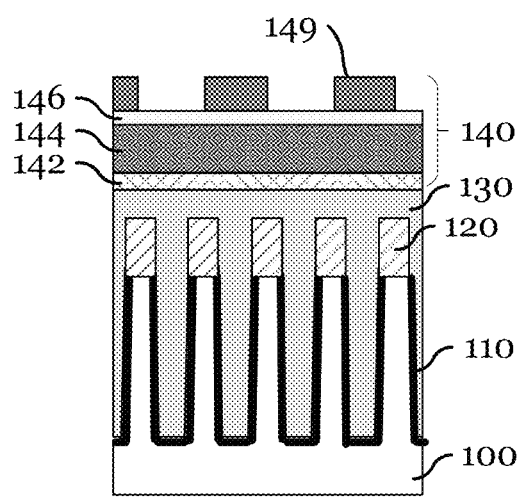

In various embodiments, the selective pre-filling may be performed by blanket deposition of the first filling material 130 (FIG. 1B) followed by patterning of the first filling material 130 to reopen some of the pre-filled recesses (FIGS. 1C-1E). In FIG. 1B, the first filling material 130 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. As illustrated in FIG. 1B, the first filling material 130 may overfill and cover the entirety of the recesses 105. In various embodiments, the first filling material 130 may comprise a dielectric material, for example, an amorphous silicon (a-Si). In certain embodiments, the first filling material 130 may comprise spin-on carbon, spin-on glass, or silicon oxide. In one embodiment, the silicon oxide may be prepared by plasma-enhanced CVD or flowable CVD using tetraethyl orthosilicate (TEOS) as a precursor. The material used for the first filling material 130 may be selected in consideration of mechanical strength and chemical stability during subsequent metal etch back steps. In one embodiment, illustrated in the SEM image of FIG. 2B, the recesses of the Si substrate illustrated in FIG. 2A may be completely filled with a-Si.

FIG. 1C illustrates a cross-sectional view of the substrate 100 after forming a layer stack for lithography.

A selected portion of the pre-filled recesses may then be reopened. In various embodiments, a lithographic process may be used to enable this selective reopening of the pre-filled recesses. First, the top surface of the first filling material 130 may be planarized, for example, by chemical mechanical planarization (CMP). Over the flattened surface of the first filling material 130, a layer stack 140 may be formed for the lithographic process. In various embodiments, the layer stack may comprise, as illustrated in FIG. 1C from bottom to top, a hardmask layer 142, an organic dielectric layer (ODL) 144, a silicon containing anti-reflective coating (SiARC) layer 146, and a photoresist layer 148. In certain embodiments, the hardmask layer 142 may comprise silicon nitride, silicon carbonitride (SiCN), or silicon oxycarbide (SiOC), silicon oxynitride, silicon carbide, titanium nitride, other suitable organic materials such as spin-on carbon hard mask (SOH) materials. In various embodiments, the ODL 144 may comprise spin-on carbon or other carbon-based materials. The illustrated structure of the layer stack 140 in FIG. 1C is only for example only, and it may have a different layer structure with different materials.

FIG. 1D illustrates a cross-sectional view of the substrate 100 after a lithographic process.

A lithographic exposure of the photoresist layer 148 with a patterned photomask creates a pattern in the photoresist layer 148, and a development step results in a patterned photoresist layer 149 as illustrated in FIG. 1D. In various embodiments, the lithographic process may be performed using an appropriate technique with sufficient resolution for patterning, for example, deep ultraviolet (DUV) lithography (e.g., dry ArF lithography and immersion ArF lithography at 193 nm) or extreme ultraviolet (EUV) lithography at about 13.5 nm. As further described below in FIG. 1E, the patterning of the photoresist should be designed to define a region for reopening of the pre-filled recesses. In certain embodiments, as illustrated in FIG. 1D, among the series of line recesses, every other line recess is selected to be reopened first, while the remainder of line recesses is selected to remain filled with the first filling material 130 during an initial metal deposition for structural reinforcement.

FIG. 1E illustrates a cross-sectional view of the substrate 100 after patterning the first filling material 130.

Figure 2C:
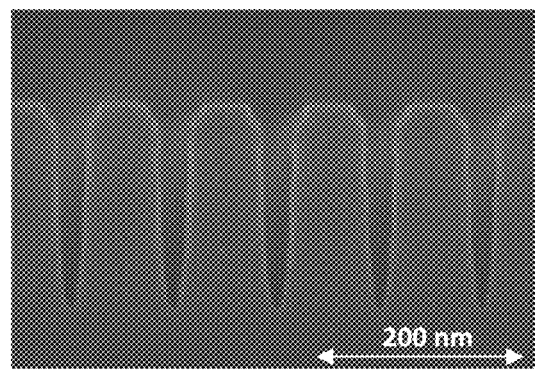

FIG. 2C illustrates a cross-sectional SEM image of the Si substrate after patterning the a-Si.

In FIG. 1E, the pattern of the patterned photoresist layer 149 defined by the lithographic process (FIG. 1D) may be transferred to the first filling material 130 by one or more pattern transfer etch processes. In various embodiments, one or more of the pattern transfer etch may be performed using plasma etch processes, reactive ion etching (RIE) processes, and/or other etch processes or combinations of etch processes, and selectively reopened recesses 106 may be formed. As a result, the first filling material 130 after the pattern transfer etch fills only selected recesses. As illustrated in FIG. 1E, in various embodiments, the selectively reopened recesses 106 may comprise every other recess of the recesses 105 of FIG. 1A. In one embodiment, illustrated in the SEM image of FIG. 2C, every other line recess of the Si substrate filled with a-Si illustrated in FIG. 2B may be reopened.

In various embodiments, this step of patterning the first filling material 130 may comprise a first pattern transfer etch that patterns the hardmask layer 142 (hardmask open), a second pattern transfer etch that patterns the first filling material 130, followed by a hardmask removal. In certain embodiments, the hardmask removal may be performed using hot phosphoric acid in a wet process that selectively etches nitride. Other remaining layers and residues from the lithographic process may also be removed by a dry and/or wet process prior to subsequent processes.

In FIGS. 1D-1E, every other recess is selected to be reopened prior to the first metal deposition. In alternate embodiments, however, any arrangement for the selective filling or reopening of recess may be applied. For example, only one out of every three recesses may be reopened. The pattern for reopening may be selected in consideration of critical dimension (CD) of the feature being fabricated and the resulting structural strength. For a highly fragile structure, one may select fewer recesses to be reopened. Introducing the step of lithography, the methods advantageously enable any pattern for selective reopening of the pre-filled recesses. With some of the recesses of the substrate 100 filled with the first filling material 130, the mechanical strength of the feature of the substrate 100 may be improved, thereby enabling subsequent metal deposition steps with a reduced risk of line bending.

FIG. 1F illustrates a cross-sectional view of the substrate 100 after forming a first liner layer 150.

In various embodiments, prior to the metal deposition, the first liner layer 150 may be formed as a thin film that conformally covers the exposed surface. The deposition of the first liner layer may be performed using vapor deposition such as atomic layer deposition (ALD) techniques. In certain embodiments, the thickness of the first liner layer 150 may be less than 1.5 nm and greater than or equal to 1 nm and, in other embodiments, less than 5 nm and greater than or equal to 0.5 nm. In various embodiments, the first liner layer 150 may comprise titanium (Ti)-based or tantalum (Ta)-based materials such as titanium nitride or tantalum nitride. In other embodiments, Ru, Co or silicon nitride (SiN)-based materials may be used.

FIG. 1G illustrates a cross-sectional view of the substrate 100 after a first metal deposition.

Figure 2D:
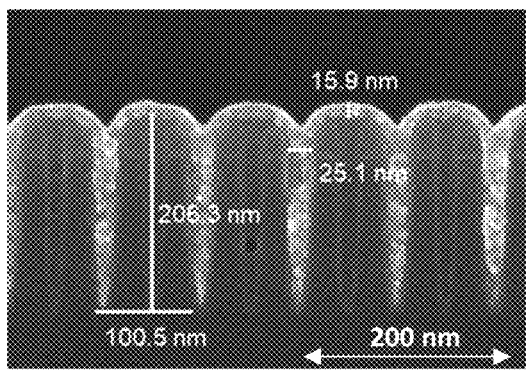

FIG. 2D illustrates a cross-sectional SEM image of the Si substrate after forming a tantalum nitride (TaN) liner layer and depositing Ru.

In FIG. 1G, a metal 160 is deposited using, for example, chemical vapor deposition (CVD), ALD, or magnetron sputtering, to completely fill the selectively reopened recesses 106. In various embodiments, the metal 160 may be deposited to overfill the selectively reopened recesses 106 such that only the metal 160 is exposed at the top surface. The ratio of the thickness of the metal 160 that fills the recess feature to the thickness of the metal 160 above the recess feature may be larger than unity, as illustrated in FIG. 1G. The ratio may be about 5:1 to about 20:1, depending on the width and aspect ratio of the recess feature. In various embodiments, the metal 160 comprises a metal with high stress such as ruthenium (Ru). In another embodiment, the metal 160 may comprise osmium (Os). In yet alternate embodiments, the metal 160 may comprise any conductive material and mixture thereof that may be useful in various semiconductor device applications. In one embodiment, illustrated in the SEM image of FIG. 2D, the remaining line recesses of the Si substrate of FIG. 2C may be completely filled with Ru with a thin TaN liner layer below Ru. Further, in yet another embodiment, the metal deposition may be performed as a series of deposition processes to form conductive layer stacks of more than one materials.

In various embodiments, the first filling material 130 advantageously provides structural support during the first metal deposition, and thereby preventing any line bending or other undesired deformation of the feature of the substrate 100. This structural support enabled by the methods may particularly be beneficial when depositing a metal with high stress such as Ru.

In one or more embodiments, after the first metal deposition, the top surface of the metal 160 may be planarized, for example, using a chemical mechanical planarization (CMP). In other embodiments, the methods may advantageously avoid a planarization process and directly proceeds to a first etch back as described below. These embodiments with no CMP may be advantageous in terms of process cost and efficiency since a CMP process generally requires substantial consumable materials such as pad, slurry, or cleaning chemicals.

FIG. 1H illustrates a cross-sectional view of the substrate 100 after a first etch back.

Figure 2E:
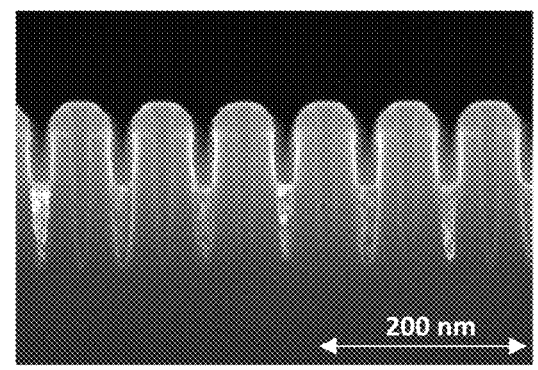

FIG. 2E illustrates a cross-sectional SEM image of the Si substrate after an etch back.

In FIG. 1H, the first etch back may be performed using plasma etch processes, reactive ion etching (RIE) processes, and/or other etch processes or combinations of etch processes. The metal 160 may be etched back such that the remainder of the metal 160 fills only a portion of the selectively reopened recesses 106. Accordingly, the first etch back may be timed and terminated when a target etch amount is achieved. In one embodiment, the first etch back may be selective to the filling material 130 as illustrated in FIG. 1H. In another embodiment, the first filling material 130 may also be removed partially or entirely.

In various embodiments, the first etch back process may be a plasma etch process using a mixture of argon (Ar), dioxygen ($O_2$), and dinitrogen ($N_2$) gases in various proportions as the plasma source gas. A direct plasma in contact with the substrate 100 may be generated and sustained in a plasma processing chamber using power from an external RF power source. Although not wishing to be limited by any theory, the oxygen (e.g., oxygen radicals (O*)) in the plasma may react with the metal atoms (e.g., Ru) at a portion of the surface exposed to the plasma to form the volatile oxides. In certain embodiments, the first etch back may be performed at room temperature. In other embodiments, the process temperature may be between 10° C. to 300° C., and in one embodiment between 10° ° C. and 50° C. In one embodiment, illustrated in the SEM image of FIG. 2E, after the first etch back, Ru partially fills the every other recess of the Si substrate, where the other line recesses remains completely filled with a-Si.

Figure 1I:
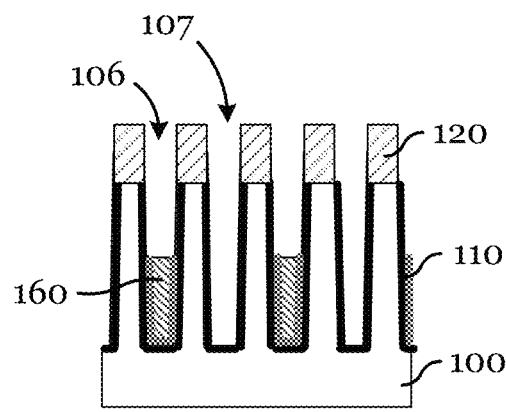

FIG. 1I illustrates a cross-sectional view of the substrate 100 after removing the first filling material 130.

In FIG. 1I, the removal of the first filling material 130 may be performed selectively to the metal 160 using a dry or wet etch process, resulting in reopened recesses 107. For example, this removal step may be done by a plasma etch process using a fluorine-containing gas as an etchant or a wet etch process using an alkaline solution such as a KOH aqueous solution. The reopened recesses 107 may then be filled with the metal 160 in subsequent steps as described below.

Figure 1J:
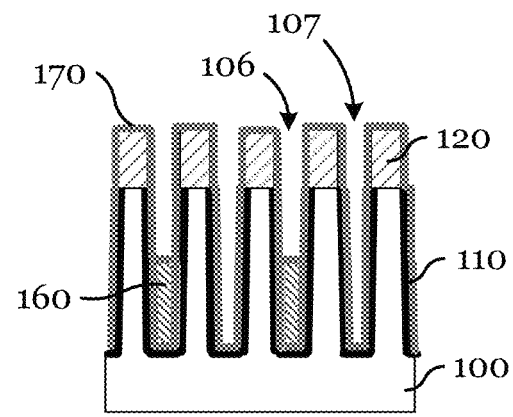

FIG. 1J illustrates a cross-sectional view of the substrate 100 after forming a second liner layer 170.

In various embodiments, the second liner layer 170 may comprise a same material as the first liner layer 150, and may be formed similarly, for example using ALD, as a thin film that conformally covers the exposed surface. In certain embodiments, the second liner layer 170 may be less than 1.5 nm and greater than or equal to 1 nm and, in other embodiments, less than 5 nm and greater than or equal to 0.5 nm.

Figure 1K:
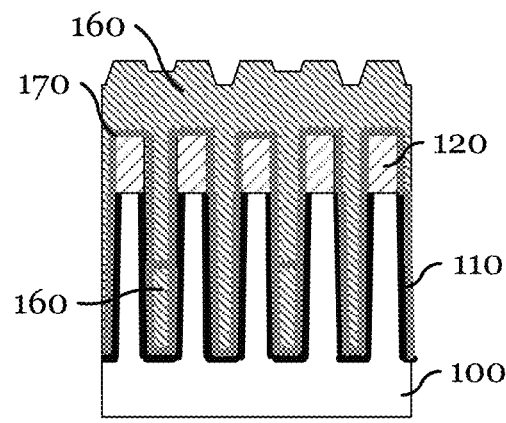

FIG. 1K illustrates a cross-sectional view of the substrate 100 after a second metal deposition.

In various embodiments, the second metal deposition may use a same material as the metal 160 as illustrated in FIG. 1K. In alternate embodiment, a different conductive material may be used in place of, or in addition to, the metal 160 may be used. Similar to the first metal deposition, the second metal deposition may be performed using, for example, CVD, ALD, or magnetron sputtering, to completely fill the reopened recesses 107 as well as the remaining portion of the selectively reopened recesses 106 of FIG. 1J. In various embodiments, as previously described for the first metal deposition, the metal 160 may be deposited to overfill the reopened recesses 107 and the selectively reopened recesses 106 such that only the metal 160 is exposed at the top surface.

Figure 1L:
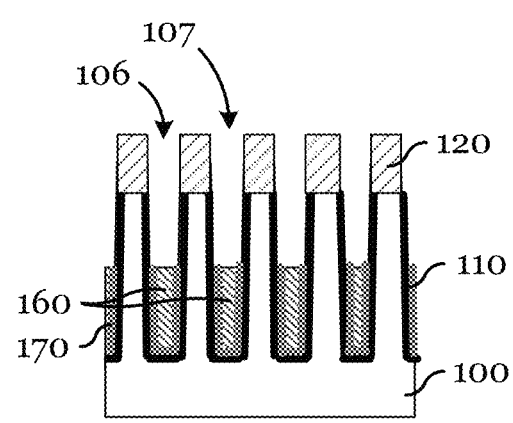

FIG. 1L illustrates a cross-sectional view of the substrate after a second etch back;

In various embodiments, the second etch back may be performed in a similar way as the first etch back, using, for example, plasma etch processes, RIE processes, and/or other etch processes or combinations of etch processes. The metal 160 may be etched back such that the remainder of the metal 160 partially fills each recess (i.e., both the selectively reopened recesses 106 and the reopened recesses 107). Accordingly, the second etch back may be timed and terminated when a target etch amount is achieved. The degree of the filling with the metal 160 may be adjusted by turning the first and second etch back processes. In various embodiments, as illustrated in FIG. 1L, a portion of each recess may have to be left open so that an insulating cap layer may be formed in subsequent steps to complete the fabrication of buried interconnect in a Logic device and buried word line (bWL) in a DRAM device. In certain embodiments, 10-90% (in height) of the recesses 105 of FIG. 1A may be filled with the metal 160 at the end of the metal deposition process (e.g., FIG. 1L), but in other embodiments 50-70% (in height) of the recesses 105 of FIG. 1A may be filled with the metal 160.

In various embodiments, the same height of the filling with the metal 160 may be desired for each recess. To minimize the variation of metal filling among recesses, the second metal deposition and the second etch back processes may be repeated as a cyclic process (e.g., FIGS. 1K and 1L). In alternate embodiments, the top surface of the metal 160 may be planarized, for example, by CMP prior to the second etch back.

Following the metal deposition, the process may further proceed to various subsequent steps. For example, one or more conductive or insulating cap layers (e.g., silicon nitride) may be formed over the metal 160 to bury the metal 160.

Figure 3A:
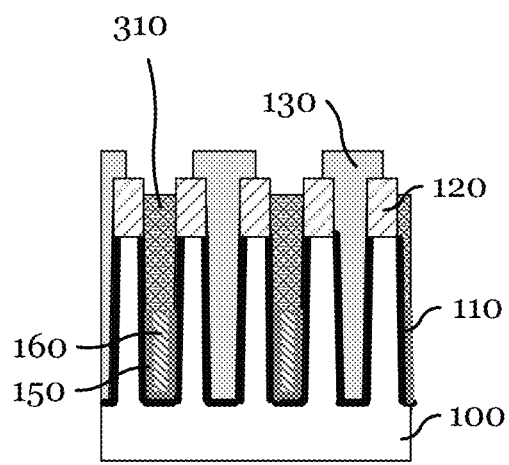
Figure 3B:
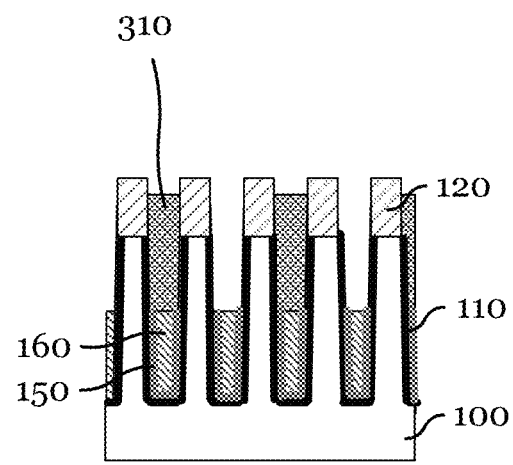

FIGS. 3A-3B illustrate cross-sectional views of an example substrate 100 during another example process of semiconductor fabrication comprising metal deposition with two filling materials at various stages in accordance with alternate embodiments. FIG. 3A illustrates the substrate 100 after a first metal deposition followed by capping with a second filling material 310.

Prior embodiments described above describe the use of a filling material for structural reinforcement. In alternate embodiments, more than one filling materials may be used to further improve the structural stability during the second metal deposition. In FIG. 3A, the substrate 100 may have a similar structure illustrated in FIG. 1A and have been processed for the deposition of a first filling material 130, patterning of the first filling material 130, and a first metal deposition with a metal 160, as described in prior embodiments (FIG. 1B-1H). At this stage (e.g., FIG. 1H), after the first etch back, the metal 160 fills the selectively reopened recesses 106 only partially, and therefore it may be possible that the feature may still suffer line bending during the second metal deposition (e.g., FIG. 1K). Accordingly, the remaining portion of the selectively reopened recesses 106 may further be filled with the second filling material 310 to provide additional structural support. In various embodiments, the second filling material 310 may comprise a dielectric material that is different from the first filling material 130. In certain embodiments, the second filling material 310 may comprise an oxide (e.g., silicon oxide, aluminum oxide, or titanium oxide), or a nitride (e.g., silicon nitride or titanium nitride). In alternate embodiments, any suitable material may be used for the second filling material 310 (e.g., oxynitride). The deposition of the second filling material may be performed using, for example, vapor deposition including chemical vapor deposition (CVD), physical vapor deposition (PVD), atomic layer deposition (ALD), as well as other plasma processes such as plasma enhanced CVD (PECVD) and other processes. In one example, trimethylaluminum (TMA) may be used in CVD to form aluminum oxide selectively within the recess feature. In one or more embodiments, the deposition may be performed using a wet process.

FIG. 3B illustrates the substrate 100 after removing the first filling material 130, a second metal deposition, and a second etch back.

Following the deposition of the second filling material 310, the series of steps (i.e., the removal of the first filling material 130, the formation of the second liner layer 170, the second metal deposition, and the second etch back) may be performed as described in prior embodiments referring to FIGS. 1I-1L. The removal of the first filling material 130 and the second etch back may be performed selectively to the second filling material 310. In certain embodiments, the second filling material 310 may advantageously be used as an insulating layer and remain during the subsequent steps that follows the second etch back.

Figure 4:
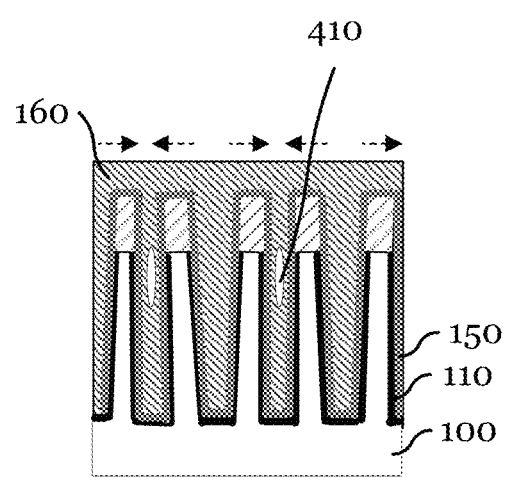
FIG. 4 illustrates an example substrate with the issue of line bending as a result of a metal deposition in the absence of the filling material.

FIG. 4 illustrates an example substrate 100 with the issue of line bending as a result of a metal deposition in the absence of the filling material.

Conventional methods that simply deposits a metal 160 to fill recesses may result in structural deformation such as line bending as illustrated in FIG. 4. In FIG. 4, each line may be bent to one direction or the other due to the stress exerted by the metal 160 during the deposition process. These issues may arise particularly when depositing a metal with high stress (e.g., Ru) to fill high aspect ratio (HAR) recesses. In some cases, another issue of the formation of voids 410 in the metal 160 may also occur due to the non-uniformity of the deposition process. Various embodiments of the methods for metal deposition described in this disclosure may advantageously overcome some of these deformation issues by providing structural support with one or more filling materials. The methods generally follows pre-filling some of the recesses with the filling material, a first metal deposition, removal of the filling material, and a second metal deposition to complete the filling of each recess. Each metal deposition step may be followed by an etch back process to achieve a flat surface of the metal with the same heights for each recess. The methods may enable various application of Ru as conductive lines such as for buried word line (bWL) in a DRAM device.

Figure 5A:
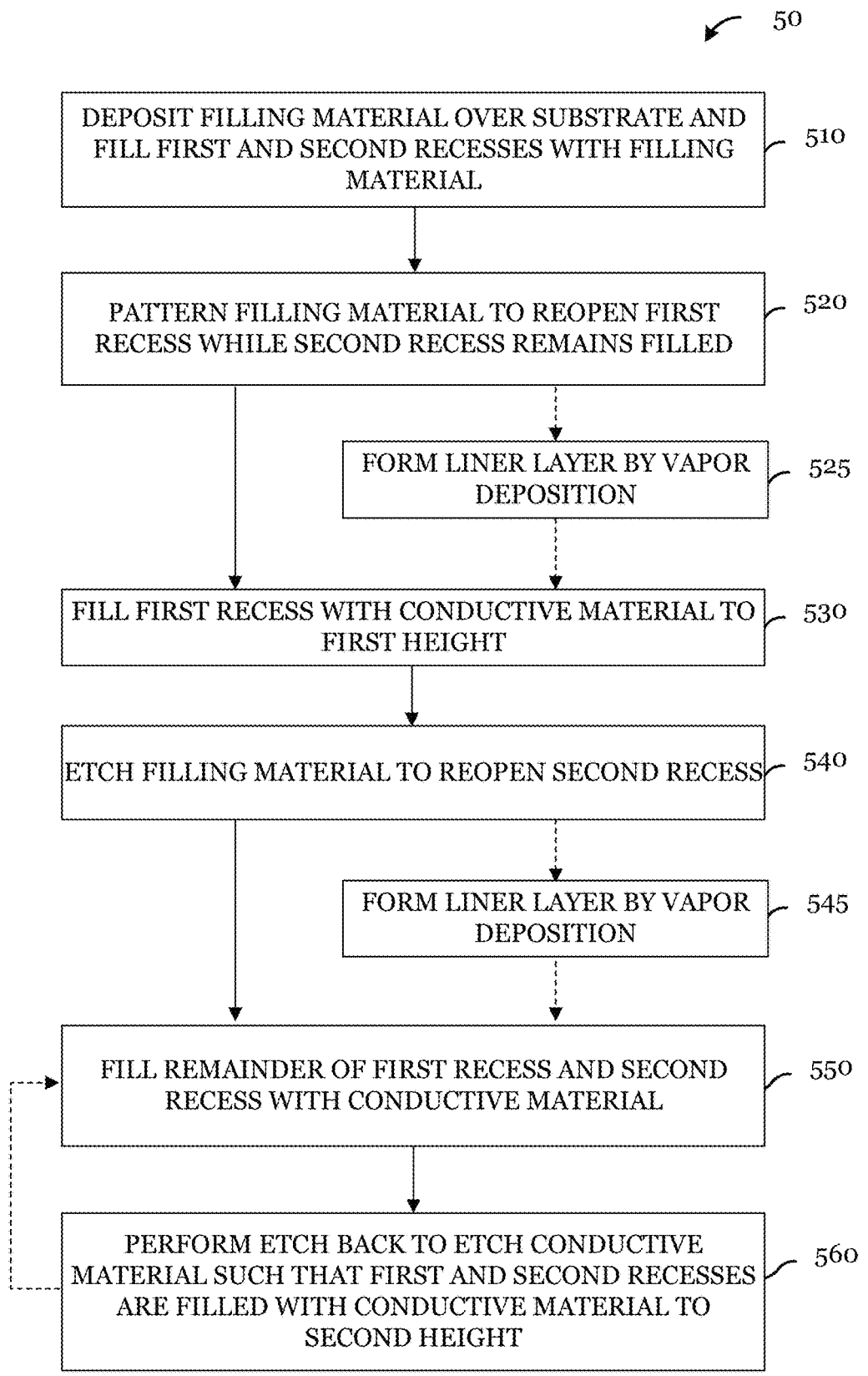
Figure 5B:
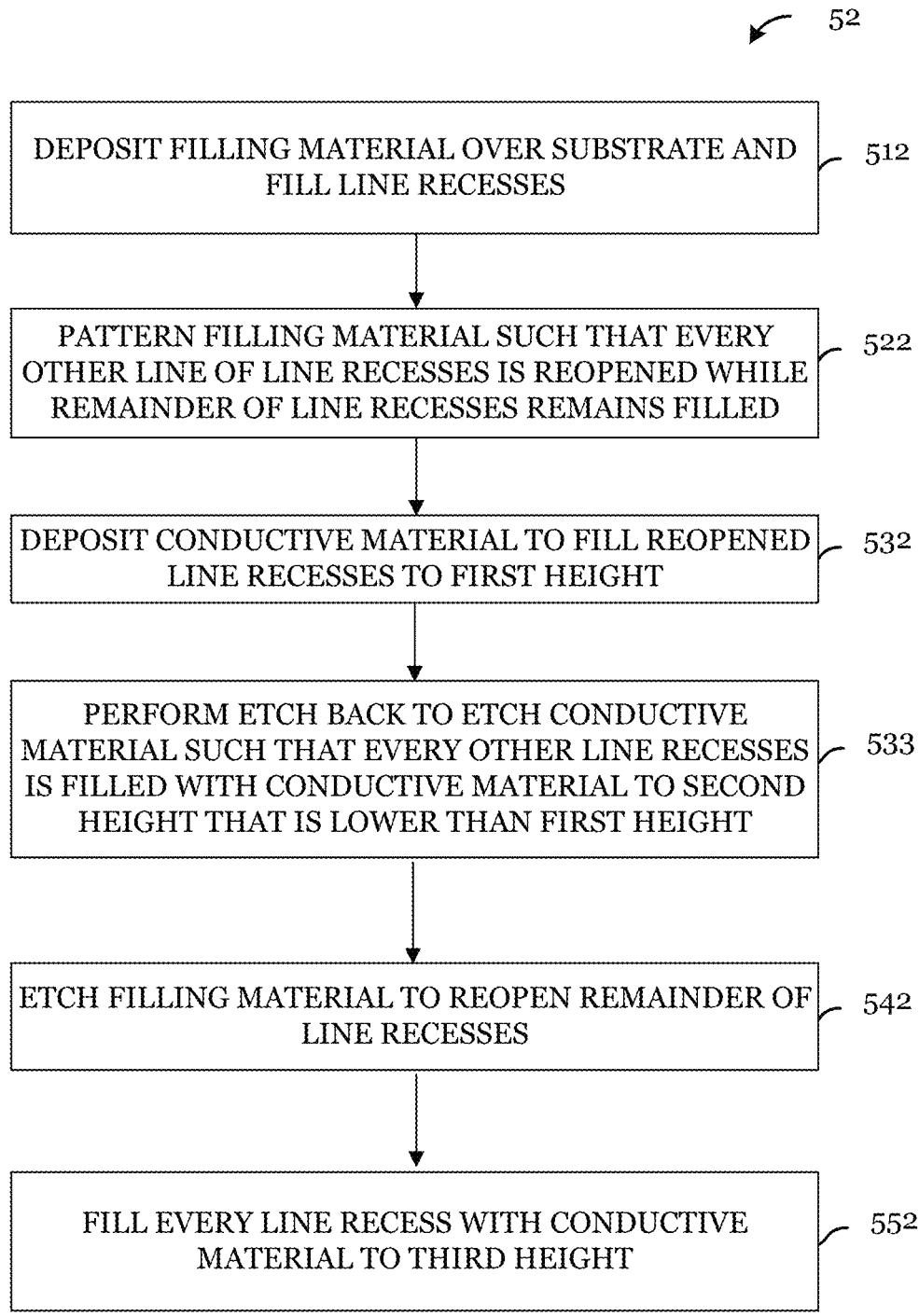
Figure 5C:
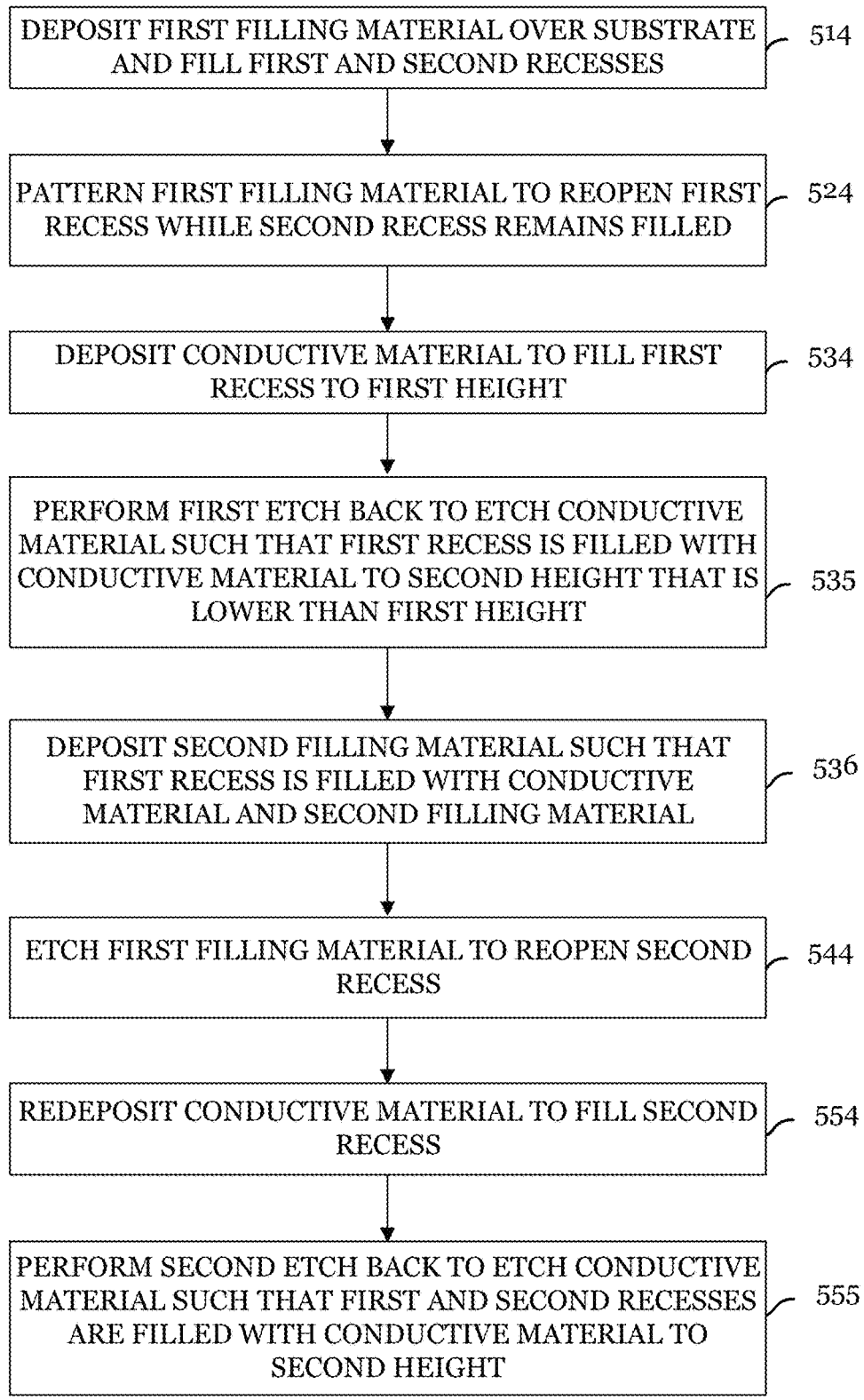

FIGS. 5A-5C illustrate process flow charts of methods of metal deposition in accordance with various embodiments. These process flows can be followed with the figures discussed above (FIGS. 1A-1L and 3A-3B) and hence will not be described again.

In FIG. 5A, a process 50 starts with depositing a filling material over a substrate and fill a first recess and a second recess of the substrate (block 510, FIG. 1B). Next, the filling material may be patterned such that the first recess is reopened while the second recess remains filled with the filling material (block 520, FIGS. 1C-1E). In certain embodiments, this patterning step (block 520) may comprise a lithographic process. Optionally, a liner may be formed by vapor deposition in certain embodiments (block 525, FIG. 1F). Subsequently, the first recess may be filled with a conductive material to a first height (block 530, FIGS.

1G-1H). In certain embodiments, this step may comprise a first conductive material deposition to overfill the first recess (FIG. 1G) followed by a first etch back process (FIG. 1H) to the first height. After the first metal deposition and the first etch back process, the filling material may be etched selectively to the conductive material to reopen the second recess (block 540, FIG. 1I). In certain embodiments, another optional liner may be formed by vapor deposition (block 545, FIG. 1J). A second conductive material deposition may then be performed to fill a remainder of the first recess and the second recess with the conductive material (block 550, FIG. 1K). A second etch back process may then be performed to etch the conductive material such that the first recess and the second recess are filled with the conductive material to a second height (block 560, FIG. 1L).

In FIG. 5B, another process 52 starts with depositing a filling material over a substrate comprising line recesses to completely fill the line recesses with the filling material (block 512, FIG. 1B), followed by patterning the filling material such that every other line of the line recesses is reopened while a remainder of the line recesses remains filled with the filling material (block 522, FIGS. 1C-1E). A conductive material may then be deposited over the substrate to fill the reopened line recesses to a first height (block 532, FIG. 1G), and subsequently an etch back process may be performed to etch the conductive material such that the every other line of the line recesses is filled with the conductive material to a second height that is lower than the first height (block 533, FIG. 1H). Next, the filling material may be etched to reopen the remainder of the line recesses (block 542, FIG. 1I), followed by filling every line recess with the conductive material to a third height (block 552, FIGS. 1K-1L).

In FIG. 5C, yet another process 54 starts with depositing a first filling material over a substrate to fill a first recess and a second recess (block 514, FIG. 1B), followed by patterning the first filling material such that the first recess is reopened while the second recess remains filled with the filling material (block 524, FIGS. 1C-1E). Next, a conductive material may be deposited over the substrate to fill the first recess to a first height (block 534, FIG. 1G). Subsequently, a first etch back process may be performed to etch the conductive material such that the first recess is filled with the conductive material to a second height that is lower than the first height (block 535, FIG. 1H). A second filling material may then be deposited over the substrate such that the first recess is filled with the conductive material and the second filling material (block 536, FIG. 3A). The first filling material may next be etched selectively to the conductive material and the second filling material to reopen the second recess (block 544), and the conductive material may be redeposited over the substrate to fill the second recess (block 554). A second etch back process may then be performed to etch the conductive material such that the first recess and the second recess are filled with the conductive material to the second height (block 555, FIG. 3B).

Example embodiments of the invention are summarized here. Other embodiments can also be understood from the entirety of the specification as well as the claims filed herein.

Example 1. A method for processing a substrate that includes: depositing a filling material over the substrate including a first recess and a second recess, the filling material filling the first recess and the second recess; patterning the filling material such that the first recess is reopened while the second recess remains filled with the filling material; filling the first recess with a conductive material to a first height; etching the filling material selectively to the conductive material to reopen the second recess; filling a remainder of the first recess and the second recess with the conductive material; and performing an etch back process to etch the conductive material such that the first recess and the second recess are filled with the conductive material to a second height.

Example 2. The method of example 1, where filling the first recess with the conductive material to the first height includes: depositing the conductive material over the substrate, the conductive material overfilling the first recess to a height greater than the first height; and performing an initial etch back process to etch the conductive material such that the first recess is filled with the conductive material to the first height.

Example 3. The method of one of examples 1 or 2, where patterning the filling material includes a lithographic process.

Example 4. The method of one of examples 1 to 3, where patterning the filling material includes: planarizing a surface of the filling material; depositing a layer stack over the filling material, the layer stack including a hardmask and a photoresist; performing a lithographic exposure to pattern the photoresist, the pattern of the photoresist corresponding the locations of the first recess and the second recess; and transferring the pattern to the filling material.

Example 5. The method of one of examples 1 to 4, further including: prior to filling the first recess with the conductive material to the first height, forming a liner by vapor deposition; and prior to filling the remainder of the first recess and the second recess with the conductive material, forming another liner by vapor deposition.

Example 6. The method of one of examples 1 to 5, further including repeating depositing the conductive material over the substrate and etching the conductive material to flatten a top surface of the conductive material.

Example 7. The method of one of examples 1 to 6, where the first height and the second height are essentially the same height.

Example 8. The method of one of examples 1 to 7, where the conductive material includes ruthenium (Ru).

Example 9. The method of one of examples 1 to 8, where the filling material includes amorphous silicon (a-Si).

Example 10. The method of one of examples 1 to 9, where the second height is between 20 nm and 300 nm and widths of the first recess and the second recess are between 5 nm and 50 nm.

Example 11. A method for processing a substrate that includes: depositing a filling material over the substrate including line recesses, the filling material filling the line recesses; patterning the filling material such that every other line of the line recesses is reopened while a remainder of the line recesses remains filled with the filling material; depositing a conductive material over the substrate, the conductive material filling the reopened line recesses to a first height; performing an etch back process to etch the conductive material such that the every other line of the line recesses is filled with the conductive material to a second height that is lower than the first height; etching the filling material to reopen the remainder of the line recesses; and filling every line recess with the conductive material to a third height.

Example 12. The method of example 11, where filling every line recess with the conductive material to the third height includes: redepositing the conductive material over the substrate, the conductive material filling the every other line of the line recesses and the remainder of the line recesses; and performing another etch back process to etch the conductive material such that every line recess is filled with the conductive material to a third height.

Example 13. The method of one of examples 11 or 12, further including repeating depositing the conductive material over the substrate and etching the conductive material to flatten a top surface of the conductive material.

Example 14. The method of one of examples 11 to 13, where the conductive material includes ruthenium (Ru), and the filling material includes amorphous silicon (a-Si).

Example 15. The method of one of examples 11 to 14, where the line recesses have a height between 20 nm and 300 nm and a width between 5 nm and 50 nm.

Example 16. The method of one of examples 11 to 15, where the line recesses have an aspect ratio (height-to-width) between 4:1 and 20:1.

Example 17. A method for processing a substrate that includes: depositing a first filling material over the substrate including a first recess and a second recess, the first filling material filling the first recess and the second recess; patterning the first filling material such that the first recess is reopened while the second recess remains filled with the filling material; depositing a conductive material over the substrate, the conductive material filling the first recess to a first height; performing a first etch back process to etch the conductive material such that the first recess is filled with the conductive material to a second height that is lower than the first height; depositing a second filling material such that the first recess is filled with the conductive material and the second filling material; etching the first filling material selectively to the conductive material and the second filling material to reopen the second recess; redepositing the conductive material over the substrate, the conductive material filling the second recess; and performing a second etch back process to etch the conductive material such that the first recess and the second recess are filled with the conductive material to the second height.

Example 18. The method of example 17, where the first filling material includes amorphous silicon (a-Si), where the second filling material includes a silicon oxide, and where the conductive material includes ruthenium (Ru).

Example 19. The method of one of examples 17 or 18, where patterning the first filling material includes: planarizing a surface of the first filling material; depositing a layer stack over the first filling material, the layer stack including a hardmask and a photoresist; performing a lithographic exposure to pattern the photoresist, the pattern of the photoresist corresponding the locations of the first recess and the second recess; and transferring the pattern to the first filling material.

Example 20. The method of one of examples 17 to 19, where depositing and redepositing the conductive material are performed by chemical vapor deposition (CVD).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:
    depositing a filling material over the substrate comprising a first recess and a second recess, the filling material filling the first recess and the second recess;
    patterning the filling material such that the first recess is reopened while the second recess remains filled with the filling material;
    filling the first recess with a conductive material to a first height;
    etching the filling material selectively to the conductive material to reopen the second recess;
    filling a remainder of the first recess and the second recess with the conductive material; and
    performing an etch back process to etch the conductive material such that the first recess and the second recess are filled with the conductive material to a second height.

2. The method of claim 1, wherein filling the first recess with the conductive material to the first height comprises:
    depositing the conductive material over the substrate, the conductive material overfilling the first recess to a height greater than the first height; and
    performing an initial etch back process to etch the conductive material such that the first recess is filled with the conductive material to the first height.

3. The method of claim 1, wherein patterning the filling material comprises a lithographic process.

4. The method of claim 3, wherein patterning the filling material comprises:
    planarizing a surface of the filling material;
    depositing a layer stack over the filling material, the layer stack comprising a hardmask and a photoresist;
    performing a lithographic exposure to pattern the photoresist, the pattern of the photoresist corresponding to locations of the first recess and the second recess; and
    transferring the pattern to the filling material.

5. The method of claim 1, further comprising:
    prior to filling the first recess with the conductive material to the first height, forming a liner by vapor deposition; and
    prior to filling the remainder of the first recess and the second recess with the conductive material, forming another liner by vapor deposition.

6. The method of claim 1, further comprising repeating depositing the conductive material over the substrate and etching the conductive material to flatten a top surface of the conductive material.

7. The method of claim 1, wherein the first height and the second height are essentially the same height.

8. The method of claim 1, wherein the conductive material comprises ruthenium (Ru).

9. The method of claim 1, wherein the filling material comprises amorphous silicon (a-Si).

10. The method of claim 1, wherein the second height is between 20 nm and 300 nm and widths of the first recess and the second recess are between 5 nm and 50 nm.

11. A method for processing a substrate, the method comprising:
    depositing a filling material over the substrate comprising line recesses, the filling material filling the line recesses;
    patterning the filling material such that every other line of the line recesses is reopened while a remainder of the line recesses remains filled with the filling material;
    depositing a conductive material over the substrate, the conductive material filling the reopened line recesses to a first height;
    performing an etch back process to etch the conductive material such that the every other line of the line recesses is filled with the conductive material to a second height that is lower than the first height;

etching the filling material to reopen the remainder of the line recesses; and filling every line recess with the conductive material to a third height.

12. The method of claim 11, wherein filling every line recess with the conductive material to the third height comprises:

redepositing the conductive material over the substrate, the conductive material filling the every other line of the line recesses and the remainder of the line recesses; and performing another etch back process to etch the conductive material such that the every line recess is filled with the conductive material to the third height.

13. The method of claim 11, further comprising repeating depositing the conductive material over the substrate and etching the conductive material to flatten a top surface of the conductive material.

14. The method of claim 11, wherein the conductive material comprises ruthenium (Ru), and the filling material comprises amorphous silicon (a-Si).

15. The method of claim 11, wherein the line recesses have a height between 20 nm and 300 nm and a width between 5 nm and 50 nm.

16. The method of claim 11, wherein the line recesses have an aspect ratio (height-to-width) between 4:1 and 20:1.

17. A method for processing a substrate, the method comprising:

depositing a first filling material over the substrate comprising a first recess and a second recess, the first filling material filling the first recess and the second recess;

patterning the first filling material such that the first recess is reopened while the second recess remains filled with the first filling material;

depositing a conductive material over the substrate, the conductive material filling the first recess to a first height;

performing a first etch back process to etch the conductive material such that the first recess is filled with the conductive material to a second height that is lower than the first height;

depositing a second filling material such that the first recess is filled with the conductive material and the second filling material;

etching the first filling material selectively to the conductive material and the second filling material to reopen the second recess;

redepositing the conductive material over the substrate, the conductive material filling the second recess; and performing a second etch back process to etch the conductive material such that the first recess and the second recess are filled with the conductive material to the second height.

18. The method of claim 17, wherein the first filling material comprises amorphous silicon (a-Si), wherein the second filling material comprises a silicon oxide, and wherein the conductive material comprises ruthenium (Ru).

19. The method of claim 17, wherein patterning the first filling material comprises:

planarizing a surface of the first filling material;

depositing a layer stack over the first filling material, the layer stack comprising a hardmask and a photoresist;

performing a lithographic exposure to pattern the photoresist, the pattern of the photoresist corresponding to locations of the first recess and the second recess; and transferring the pattern to the first filling material.

20. The method of claim 17, wherein depositing and redepositing the conductive material are performed by chemical vapor deposition (CVD).

* * * * *

UNITED STATES PATENT AND TRADEMARK OFFICE
CERTIFICATE OF CORRECTION

| | | |
|---|---|---|
| PATENT NO. | : 12,417,925 B2 | Page 1 of 1 |
| APPLICATION NO. | : 18/070030 | |
| DATED | : September 16, 2025 | |
| INVENTOR(S) | : Aizawa et al. | |

It is certified that error appears in the above-identified patent and that said Letters Patent is hereby corrected as shown below:

In the Claims

In Column 14, in Claim 2, Line 14, before "filling" insert -- the --.

In Column 14, in Claim 3, Line 22, before "patterning" insert -- the --.

In Column 14, in Claim 4, Line 24, before "patterning" insert -- the --.

In Column 15, in Claim 12, Line 5, before "filling" insert -- the --.

In Column 16, in Claim 19, Line 23, before "patterning" insert -- the --.

In Column 16, in Claim 20, Line 32, before "depositing" insert -- the --.

In Column 16, in Claim 20, Line 33, before "redepositing" insert -- the --.

Signed and Sealed this
Twenty-fifth Day of November, 2025

John A. Squires
*Director of the United States Patent and Trademark Office*